United States Patent [19]
Felten

[11] Patent Number: 5,874,197
[45] Date of Patent: Feb. 23, 1999

[54] THERMAL ASSISTED PHOTOSENSITIVE COMPOSITION AND METHOD THEREOF

[75] Inventor: John James Felten, Chapel Hill, N.C.

[73] Assignee: E. I. du Pont de Nemours and Company, Wilmington, Del.

[21] Appl. No.: 936,485

[22] Filed: Sep. 18, 1997

[51] Int. Cl.[6] ............................. G03F 7/033; G03F 7/38; G03F 7/40
[52] U.S. Cl. ................... 430/281.1; 430/288.1; 430/285.1; 430/311; 430/330; 522/311; 522/330
[58] Field of Search ................. 430/288.1, 285.1, 430/281.1, 311, 330; 522/81, 83, 13, 62

[56] References Cited

U.S. PATENT DOCUMENTS

| | | | |
|---|---|---|---|
| 2,760,863 | 8/1956 | Plambeck, Jr. | 95/5.6 |
| 2,850,445 | 9/1958 | Oster | 204/158 |
| 2,875,047 | 2/1959 | Oster | 96/35 |
| 3,074,974 | 1/1963 | Gebura | 260/348.6 |
| 3,097,096 | 7/1963 | Oster | 96/30 |
| 3,097,097 | 7/1963 | Oster et al. | 96/35 |
| 3,145,104 | 8/1964 | Oster et al. | 96/33 |
| 3,427,161 | 2/1969 | Laridon et al. | 96/35.1 |
| 3,479,185 | 11/1969 | Chambers, Jr. | 96/84 |
| 3,549,367 | 12/1970 | Chang et al. | 96/35.1 |
| 3,684,771 | 8/1972 | Braun | 260/77 |
| 3,788,996 | 1/1974 | Thompson | 252/62.54 |
| 4,032,698 | 6/1977 | Ashe | 526/14 |
| 4,070,388 | 1/1978 | Jones | 260/455 A |
| 4,162,162 | 7/1979 | Dueber | 96/115 P |
| 4,613,560 | 9/1986 | Dueber et al. | 430/286.1 |
| 5,006,436 | 4/1991 | Hung et al. | 430/284.1 |
| 5,032,478 | 7/1991 | Nebe et al. | 430/281.1 |
| 5,185,385 | 2/1993 | Kanluen et al. | 522/84 |

FOREIGN PATENT DOCUMENTS 1339930  12/1973  United Kingdom .

OTHER PUBLICATIONS

Jakubauskas, Use of A–B Block Polymers . . . , *Journal of Coating Technology*, 58(736), 71–82, 1986.

*Primary Examiner*—Cynthia Hamilton

[57] ABSTRACT

A photosensitive thick film composition comprising an admixture of: (a) finely divided electrically conductive or dielectric particles, dispersed in; (b) an organic medium, comprising: (1) at least one acrylic monomer, (2) a photo-initiation system, (3) a thermal assist catalyst; and (4) an acidic acrylic polymer. The invention is further directed to a single print process for the use thereof.

18 Claims, No Drawings

THERMAL ASSISTED PHOTOSENSITIVE COMPOSITION AND METHOD THEREOF

FIELD OF THE INVENTION

The present invention is directed to an improved photosensitive thick film composition with a thermal assist catalyst. The invention is further directed to a single print process utilizing such composition.

BACKGROUND OF THE INVENTION

Photopatterning of thick film conductor compositions has long been used to achieve very fine lines (three mils or less line/space pitch) found in high density circuits. Unfortunately, the thickness or the height of lines that are achievable with photopatterning methods has been rather low. Since the metal powders found in compositions that are used in the photosensitive methods are opaque, the surface must be over-exposed to achieve crosslinking beneath the surface. The overexposure leads to the phenomena of undercut and edge curl. Upon exposure the top surface width of the patterned print is greater than the underlying regions resulting in undercut of the patterned edges during development, and subsequent edge curl when the patterned print is sintered at high temperatures.

In further explanation, edge curl and undercut problems are caused by intense surface polymerization that occurs in photopatterned films that have particulate phases that strongly absorb UV light. Since acrylic monomers shrink during polymerization by several percent or more (as much as 18%), a film that polymerizes only on the top surface will do two things. First, it will cause monomer at the surface to strongly crosslink. Secondly, monomer directly beneath the polymerized layer, migrates to the boundary of the polymerized region, where it reacts with the partially polymerized material at the boundary. Thus, the region directly beneath the polymerized region becomes depleted in monomer, causing the region in the film just beneath the polymerization front to be more rapidly washed out during development. However, both the crosslinked top region and the region of the film below the boundary that has not been depleted in monomer are more slowly washed out. This causes a washed out gap in the edges of patterned features at the point between the polymerization boundary and the deeper, unpolymerized portions of the film. Since the top and bottom regions of the film edge are, in effect, disconnected by this crease or gap, during firing the two regions sinter separately, permitting the top region to pull upward. It is believed that the edge curl turns upward because the surface regions of the film are the most heavily polymerized, and have the heaviest concentration of monomer. Since the organic content of the top layer of the film is higher, it has a lower metal content, and will shrink more during firing than regions with higher metal content below the surface. This creates a situation similar to that in a bimetallic strip or thermostat. One layer shrinks more than the other, and the film curls in that direction, i.e., upward.

If excessive crosslinking can be sufficiently reduced near the surface of the exposed film, in principle, there will be no weak region beneath the exposed film, hence no undercut or edge curl. For example, it has been demonstrated that edge curl is reduced in gold films that have less exposure to UV light, compared to more heavily exposed films. The problem with using less exposure is that finer features are lost, so resolution and edge definition both suffer as exposure is reduced. This invention offers a solution to this problem. Therefore, the present invention reduces or eliminates edge curl while simultaneously increasing the achievable height of the fine lines to over twelve microns after firing and substantially reducing the intensity of exposure to UV light necessary to generate a high quality pattern. This is accomplished with a new composition and process in which it is not necessary to have light penetrate completely through a printed layer because of the use of a thermal assist catalyst in the composition.

SUMMARY OF THE INVENTION

The invention is directed to a photosensitive thick film composition comprising an admixture of: (a) finely divided electrically conductive or dielectric particles, dispersed in; (b) an organic medium, comprising: (1) at least one acrylic monomer, (2) a photoinitiation system, (3) a thermal assist catalyst; and (4) an acidic acrylic polymer.

The invention is further directed to a single print process for the formation of fine conductor lines on a substrate comprising the sequential steps of: a. applying the paste of claim 3 to cover an area to be patterned over a substrate, in a sufficient amount to produce sintered patterns with a thickness of 4 to 20 microns; b. drying the paste at a temperature sufficient to cause partial thermally induced polymerization and simultaneously drive off the solvent; c. imagewise exposing the dried paste patternwise to actinic radiation to produce a latent image; d. thermally treating the patterned paste to induce further polymerization leading to crosslinking in exposed areas of the print, so that exposed areas become insoluble in the developing fluid; e. developing the patterned paste in a suitable developer fluid to wash away unexposed areas of the patterned paste; and f. sintering the patterned paste.

DETAILED DESCRIPTION OF THE INVENTION

New compositions coupled with the method of the present invention reduce or eliminate edge curl and undercut. One aspect of the present invention is attributed to improved particle size selection which substantially improves particle packing and enhances light penetration. An additional benefit of optimized particle size is a reduction in the necessary thickness of films before patterning. The preferred particle size distribution (PSD) used in the industry today is monomodal at 2 to 3 micron average; smaller particles with monomodal PSD absorb light excessively and photopolymerization is retarded. Intense light exposure even with 2 to 3 micron PSD is necessary to penetrate the film and achieve adequate polymerization of the monomers in the film. This results in high resolution and good edge definition for a finished lines 6 microns in thickness and under. Opacity of the films formed from the metal powder necessary for this process causes edge curl to increase rapidly as thickness increases, with onset of cracking at 8 to 9 microns fired thickness. Films with desired thickness greater than 5 to 6 microns cannot depend on photopolymerization throughout the film. The present invention does not prefer monomodal size distribution. Many types of gold or silver powder, or other conductive or dielectric solids, preferably spherical particles, may be used in practicing the present invention. The many types may be mixed to achieve the desired particle size distribution. In principle, the approaches described are applicable to any solids system, providing the solid filler of an organic resist absorbs light to the extent that it interferes with photopolymerization of the composition. The preferred compositions involve the use of a trimodal electrically conductive combination of powders wherein the particle sizes are carefully chosen, i.e., the average particle size of the largest particle found in the composition is up to 8 microns, with the preferred size being at least 3 microns. The next largest size will preferably be from one half to one eighth the size of the largest, with the smallest fraction preferably one half to one eighth the size of the second fraction. The volume relationship is preferably close to the range of 10:3:1 to 4:2:1 by volume for each fraction (large:middle:small. Another option for powder particle size would be compositions with bimodal particle size distribution, such as a mixture of large particles (3 to 8 microns PSD) and small particles (0.4 to 4 microns PSD). The preferred range of the bimodal compositions of the invention lay in the range of 4:1 to 1:1 but more preferably the smaller particles in a bimodal mixture are about one third by volume of that of the larger. For example, if a 5 micron large particle is used then the smaller one is preferably 0.6 to 2.5 microns. The benefit of using a bimodal approach is not as great as that of the trimodal particle size distribution with regard to higher solids loading and better rheological control but the bimodal approach is preferable to a mono-modal particle size distribution in terms of overall performance. The finely divided electrically conductive or dielectric solids which are referred to as inorganic solids comprise 50 to 88 wt. % of the composition, with preferred ranges of 50–60 wt. % for dielectric solids, 65–78 wt. % for silver particles and 78–88 wt. % for gold particles.

It is unnecessary to polymerize the film throughout to generate a satisfactory pattern for line formation. A stable top layer of exposed material protects the underlying unpolymerized film in much the same way as standard photoresist protects copper foil beneath to form etched copper circuits. Furthermore, calculations showed that a multimodal particle size distribution permitted a surprising amount of light to penetrate the film. This is based on the use of a larger PSD material for the main fraction, using smaller particles to fill in voids between the larger particles. The smaller particles tend to occupy the space above and beneath the larger particles that would otherwise be unoccupied; these particles do not contribute to effective light absorption, since they, in effect, occupy the shadow of the larger particles. Higher solids loading is generated as well, which reduces the thickness needed for a given metal content. The underlying layer that is not exposed to light because of the opacity of the larger particles which shade the underlying layer from the light is then further hardened by using a thermal catalyst in the composition. Thermal catalysts cause a reaction to be carried out throughout the film, whereby the photoresist is partially crosslinked but still remains soluble in the alkaline wash solution. In the process of exposing a film with U.V. light, a significant fraction of UV energy goes to cause monomer molecules to react with other monomer molecules to become dimers or relatively low MW oligomers. Much of the remaining UV energy goes to react the dimers with other molecules to become trimers and oligomers. At this point, the film is still soluble in carbonate but a small amount of further polymerization will cause the film to crosslink to a significant degree and become insoluble. In the process described herein, this property of the monomer-containing polymeric film is used to permit adequate crosslinking to produce high resolution without using large amounts of UV light that polymerize the surface layers excessively, hence cause excessive undercut/edge curl. Much of the work of crosslinking is being done thermally, so a relatively smaller amount of UV exposure is necessary to insolubilize exposed areas. This helps prevent large amounts of monomer from migrating to the surface of the film, thereby reducing edge distortion ("edge curl") as well as undercut at the edges in areas beneath the surface where the film has been depleted of monomer. The thermal assist catalyst is a free radical catalyst sufficient in concentration to permit up to a 70% reaction of active monomer sites by aging at an elevated temperature preferably for several minutes to a half hour. Typically, 0.3 to 1.2 wt. % of the organic medium portion of the composition is catalyst with 0.4 to 1.0 wt. % preferred. Examples of thermal assist catalysts are Vazo® 88 (1,1'-azobiscyclohexanecarconitrile), Vazo® 64 (2-methyl, 2,2'-azoabispropanenitrile) and Vazo® 52 (2,4-dimethyl, 2,2'-azobispentanenitrile) all products available from E. I. du Pont de Nemours and Company, Wilmington, Del.

Ten to thirty-three % (wt) and preferably fifteen to thirty % (wt) of the total organic portion of the composition, with fifteen to thirty-five % preferred, is composed of "monomers", or low molecular weight (typically <3000 A.U. with preferred <1000 A.U.) esters of acrylic acid, usually trifunctional, which may be combined with tetra-, di-, or monofunctional monomers. "Trifunctional" as defined herein is an ester which contains three acrylate or methacrylate groups. For example, "TEOTA 1000" is not a single pure composition, but an acrylate ester of trimethylolpropane with several ethylene oxide moieties between the acrylate and the trimethylolpropane. "TEOTA 1000" is produced by reacting ethylene oxide, trimethylolpropane and acrylic acid, and has an average molecular weight of 1000. Similarly, "TMPTA" consists of one molecule of trimethylolpropane esterified with three moles of acrylic acid to form trimethylolpropanetriacrylate (no ethylene oxide added). An ester of lauryl alcohol and methacrylic acid (lauryl methacrylate) may be used as an addition to the monomers. Since this addition reduces crosslinking and limits molecular weight (only one functional group, so crosslinking is less extensive), it is expected to reduce the amount of organics at the film surface.

The polymer component used to hold the dried film together and which adds viscosity to the thick film paste is a copolymer of methyl methacrylate and free methacrylic acid. The preferred ratio of methacrylic acid to methyl methacrylate is between 5:1 and 3:1. Typically, if less than 15% of the monomeric units of the polymer is methacrylic acid, the polymer will be insufficiently water soluble to permit development in a carbonate solution. If more than 30% is a methacrylic acid, the polymer becomes too soluble and tends to wash off too easily. As to molecular weight (MW), in a screen printed photopatternable paste low molecular weight is advantageous because it forms low viscosity solutions. These compositions need high resin content, and a low molecular weight permitting easily printable compositions with high solids loading of both resin and inorganic solids. Since films using low MW resins tend to be more brittle than films using high MW polymer, tape-on-substrate (TOS) compositions tend to use higher MW resins such as B.F. Goodrich XPD-1034. Since these materials are cast from low solids slips, the effect of high solids loading on rheological properties does not apply. The higher MW gives films that are less brittle and can more easily survive flexing than films made with XPD-1234.

Methyl methacrylates are desirable in compositions that are used in thick films that need to be burned out, since methyl methacrylate burns out cleanly and at relatively low temperatures. Differences, especially in nitrogen firing, can be seen in burnout of films made with methacrylate vs. acrylate. Unfortunately, some of the methacrylate monomers polymerize more slowly than acrylate based ones. In practice, acrylates are used because of faster exposure times.

Suitable photoinitiation systems for use in the invention are those which are thermally inactive but which generate free radicals upon exposure to actinic light at or below 185° C. Typically, the photoinitiation systems make up about 3 to 9 wt. % of the organic medium, with preferably 5 to 7 wt. %. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenyl-anthraquinone, 2,3-diphenylanthraquinone, retenequinone, 7,8,9,10-tetrahydronaphthracene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162.

The glass frits which may be used in the present invention aid in sintering the inorganic crystalline particulates and may be of any well known composition which has a melting temperature below that of ceramic solids. Nevertheless, in order to get adequate hermeticity of the devices, it is preferred that the glass transition temperature ($T_g$) of the inorganic binder be 550°–825° C. and still more preferably 575°–750° C. If melting takes place below 550° C., an organic material will likely be encapsulated and blisters will tend to form in the dielectric layer as the organics decompose. On the other hand, a glass transition temperature above 825° C. will tend to produce a porous dielectric when sintering temperatures compatible with copper metallization, e.g., 900° C., are used.

The glass frits most preferably used are the borosilicate frits, such as lead borosilicate frit, bismuth, cadmium, barium, calcium or other alkaline earth borosilicate frits. The preparation of such glass frits is well known and consists, for example, in melting together the constituents of the glass in the form of the oxides of the constituents and pouring such molten composition into water or otherwise rapidly cooling to produce highly strained particles that are then further milled to form the frit. The batch ingredients may, of course, be any compound that will yield the desired oxides under the usual conditions of frit production. For example, boric oxide will be obtained from boric acid, silicon dioxide will be produced from barium carbonate, etc. The glass is preferably milled in a vibratory (Sweco Co.) mill with water to reduce the particle size of the frit and to obtain a frit of substantially uniform size.

Thereafter the frit is preferably processed in a similar manner as the ceramic solids. The frit is passed through a fine mesh screen to remove large particles since the solid composition should be agglomerate free. The inorganic binder like the ceramic solids should have a surface to weight ratio of no more than 10 m$^2$/g and at least 90 wt. % of the particles preferably have a particle size of 1–10 μm.

It is preferred that the d50 of the inorganic binder, which is defined as equal parts by weight of both larger and smaller particles, be equal to or less than that of the ceramic solids. For given particle size ceramic solids, the inorganic binder/ceramic solids ratio required to achieve hermeticity will decrease as the inorganic binder size decreases. With a given ceramic solids-inorganic binder system, if the ratio of inorganic binder to ceramic solids is significantly higher than that required to achieve hermeticity, the dielectric layer tends to form blisters on firing. If the ratio is significantly lower, the fired dielectric will be porous and therefore nonhermetic.

A dispersant may be used to insure the efficient wetting of the inorganic by the organic polymers and monomers. The dispersant acts to allow the polymer binder to associate or wet the inorganic solids, giving an agglomerate free system. Dispersants that have been successfully used are the A-B dispersants generally described in "Use of A-B Block Polymers as Dispersants for Non-aqueous Coating Systems" by H. L. Jakabauskas, Journal of Coating Technology, Vol. 58; Number 736; Pages 71–82. Useful A-B dispersants are disclosed in U.S. Pat. Nos. 3,684,771; 3,788,996; 4,070,388 and 4,032,698 and U.K. Pat. No. 1,339,930 each of which are incorporated herein by reference. A preferred class of A-B dispersants are polymeric materials disclosed in U.S. Pat. No. 4,032,698 supra represented by the structure

where

Q is a polymeric or copolymeric segment of
  a. an ester of acrylic acid or methacrylic acid with an alkanol of 1–18 carbon atoms;
  b. styrene or acrylonitrile;
  c. a vinyl ester whose ester moiety contains 2–18 carbon atoms; or X is the residue of a chain transfer agent;

Y is the residue of a di-, tri-, or tetraisocyanate radical after removal of isocyanate groups;

A is the residue of a basic radical which, as an entity before reaction, has a pK$_α$ value of 5–14, or a salt thereof; and m and n are 1, 2 or 3, the total not exceeding 4, provided that when n is 2 or 3, only of A need be as defined.

A particular preferred member of this class is a polymeric material, hereinafter identified as A-B Dispersant I, represented by the structure

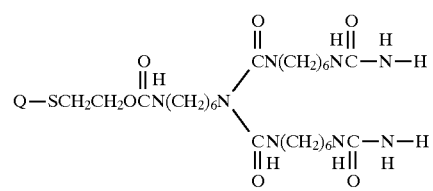

where Q is a methylmethacrylate polymeric segment having a weight average molecular weight between 6000 and 8000. Also particularly preferred is a member of a class of polymeric materials represented by the structure

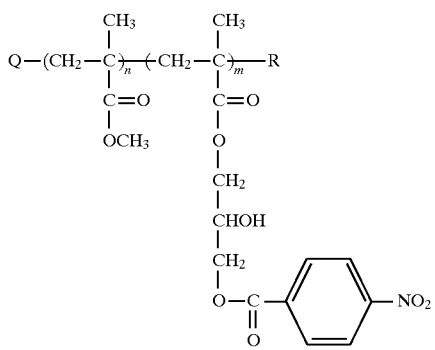

wherein Q is an alkyl methacrylate polymeric segment containing about 20 units of butyl methacrylate, n is 20, m is 8 to 12 and R is a chain terminator residue. This dispersant is hereinafter identified as A-B Dispersant II.

The combination of solvent, monomer, polymer, initiators, optionally stabilizers, dispersants, plasticizers and minor amounts of other components is called the organic medium. The organic medium comprises about 12 to 50 wt. % of the thick film composition. The organic medium must first and foremost be one in which the solids are dispersible with an adequate degree of stability. Secondly, the Theological properties of the organic medium must be such that they lend good application properties to the dispersion. Photosensitive thick film compositions typically use an acrylic resin that is soluble in dilute carbonate aqueous solution. The solvent component of the organic medium, which may be a mixture of solvents, is chosen so as to obtain complete solution therein of the polymer and to be of sufficiently high volatility to enable the solvent to be evaporated from the dispersion by the application of relatively low levels of heat at atmospheric pressure. In addition, the solvent must evaporate below the boiling point and decomposition temperature of any other additives contained in the organic medium except for the thermal catalyst. Thus, solvents that may readily be evaporated below 100° C. are used most frequently. Such solvents include 2,2,4-triethyl pentanediol-1,3-mono-isobutyrate and ethylene glycol monoalkyl and dialkyl ethers such as ethylene glycol mono-n-propyl ether. For example, TEXANOL® from Eastman Chemicals has been used successfully as solvent in photopatternable compositions. For casting films, solvents such as methylene chloride are preferred because of their volatility. In the formation of a green tape, which is an alternative to the thick film paste, the composition of the finished tape is similar to the composition of the printed and dried paste, with more plasticizer added to lower the Tg of the binder polymer. Plasticizer helps to assure good lamination to ceramic substrates and enhance the developability of unexposed areas of the composition. Choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate and polyester plasticizers. Dibutyl phthalate is frequently used with acrylic polymer systems because it can be used effectively in relatively small concentrations.

The photosensitive compositions of the invention, when coated upon a support film are referred to as "tape". In these tapes it is necessary, or at least highly desirable, to protect the photosensitive layer by a removable cover sheet in order to prevent blocking between the photosensitive layer and the reverse surface of the support when stored in roll form. It is also desirable to protect the layer laminated to a substrate by means of the removable support film during imaging exposure to prevent blocking between the layer and the phototool.

The photopolymerizable composition is coated upon the support film at a dry coating thickness of about 0.001 to 0.010 inch (~25 to 50 microns) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (13 microns) to 0.008 inch (~200 microns) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.001 inch (~25 microns).

When a composition contains no removable protective cover sheet and is to be stored in roll form, the reverse side of the strippable support preferably has applied thereto a thin release layer of a material such as wax or silicone to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~25 microns) thick polyethylene is especially suitable. Supports and cover sheets as described above provide good protection to the photopolymerizable resist layer during storage prior to use. The ratio of inorganic solids to organics is dependent on the particle size of the inorganic solids, the organic components and on surface pretreatment of the inorganic solids. When the particles are treated with organosilane coupling agents, the ratio of inorganic solids to organics can be increased. It is preferred to use a lower level of organics to minimize firing defects. It is especially important that the ratio of inorganics to organics be as high as possible. Organosilanes suitable for use in the invention are those corresponding to the general formula RSi(OR')$_3$ in which R' is methyl or ethyl and R is selected from alkyl, methacryloxypropyl, polyalkylene oxide or other organic functional groups which interact with the organic matrix of the film.

On the other hand, when the dispersion is to be applied as a thick film paste, conventional thick film organic media can be used with appropriate rheological adjustments and the use of lower volatility solvents.

When the compositions of the invention are formulated as thick film compositions, they will usually be applied to a substrate by means of screen printing. Therefore, they must have appropriate viscosity so that they can be passed through the screen readily. While the rheological properties are of primary importance, the organic medium is preferably formulated to give appropriate wettability of the solids to the substrate, good drying rate, dried film strength sufficient to withstand rough handling and good firing properties. Satisfactory appearance of the fired composition is also important.

The ratio of organic medium to inorganic solids in the dispersions can vary considerably and depends upon the manner in which the dispersion is to be applied and the kind of organic medium used. Normally, to achieve good coverage, the dispersions will contain complementally by weight 50–90% solids and 50–10% organic medium. Such dispersions are usually of semifluid consistency and are referred to commonly as "pastes".

The pastes are conveniently prepared on a three-roll mill. The viscosity of the pastes is typically within the range of 25–200 pascal-seconds. The amount and type of organic medium (vehicle) utilized is determined mainly by the final desired formulation viscosity and print thickness.

Minor amounts of other components can be present in the photopolymerizable compositions, e.g., pigments, dyes, thermal polymerization inhibitors, adhesion promoters, such as organosilane coupling agents, plasticizers, coating aids such as polyethylene oxides, etc. so long as the photopolymerizable compositions retain their essential properties. Organosilanes may be particularly useful in quantities of 3 wt. % or less based on the weight of the inorganic particles. Treated particles have a lower demand for organics. Thus, the level of organics in the coating can be reduced, which results in easier burnout upon firing. The organosilane can also improve the dispersion properties and allow a lower inorganic binder/ceramic solids ratio at equivalent hermeticity.

The photosensitive coating compositions are conventionally applied to a substrate suitable for cermet films in formation of a layer such as in the form of a film applied to the substrate or in the form of a paste applied such as by silk screening. When applied as a paste a sufficient layer is formed to cover areas to be patterned and to allow for a finished sintered layer of 4–20 microns. The layer is then thermally treated at a temperature (typically 80°–120° C.) sufficient to cause some thermally induced polymerization and simultaneously drive off any solvent, if present. When the composition is applied as a tape, the thermal treatment, described above, may or may not be necessary depending on the needs of the end use. Since the remaining steps are identical for the layer originating as a paste or as a tape, collectively the paste, devoid solvent, or tape shall be referred to as "layer" for the remainder of the process description. Thereafter, the layer is imagewise exposed to actinic radiation to obtain areas which have been exposed to actinic radiation and areas which have not been exposed.

The layer, again, is thermally cured to a point just short of where it becomes insoluble in developer solution. With this process, only a relatively small amount of actinic exposure, e.g. ultraviolet (UV) exposure, will be needed to polymerize the monomers sufficiently to insolubilize layer—as little as one third or less of the amount as needed without the thermal assist. This performance gain is maximized by partially thermally curing the layer both before and after exposure. Before exposure, the monomer is presumed to form principally dimers and oligomers. These, being higher in molecular weight than monomers, are presumed to migrate toward the surface less readily. This appears to permit a higher dose of UV radiation without causing the excessive diffusion of monomer to the surface of layer that results in undercut and edge curl. A second post exposure cure crosslinks the layer to the point that it is insolubilized in even slightly exposed areas beneath the surface. This gives an even greater benefit in reducing undercut. It is suspected that the post cure temperature (80° to 120° C.) causes some intermigration and crosslinking of partially polymerized material and monomer at the boundary layer, knitting the top and bottom parts of the layer together. This deepens the non soluble portion of the layer that protects remaining underlying material. Unexposed areas of the layer are removed in a process known as development. For aqueous development the layer will be removed in those areas which are not exposed to radiation but exposed portions will be substantially unaffected during development by a liquid such as wholly aqueous solutions containing 0.3% to 3.0% sodium carbonate by weight within the typical development duration. Usually development takes place within 0.25 to 2 minutes. Totally unexposed regions, though partially polymerized by the thermal cure steps, remain sufficiently uncrosslinked to remain soluble in the washout solvent, hence are washed out during development. The developed patterned layer is then fired typically at greater than 500° C.

The present invention will be described in further detail by giving practical examples. The scope of the present invention, however, is not limited in any way by these practical examples.

EXAMPLES

The inorganic powders used in the examples below are expected to be known to formulators skilled in the art of paste preparation. Precision for ingredients in the recipes is +/−0.1% except for TAOBN, which is to 0.001% of total weight; actual totals thus presented are 100.014%. Pastes were prepared using techniques familiar to one skilled in the art of paste preparation. Screen printing was done in a manner familiar to one skilled in the art.

Example I

The following formulation is for a bimodal gold composition that can be printed and fired to about 9 microns in height. The minute silver powder addition is needed for aluminum wire bonding performance.

| Formulation | Parts (wt.) |
| --- | --- |
| Ektasolve DE Acetate | 6.00% |
| Polymer XPD-1234 (PMMA/MAA copolymer) | 6.06 |
| Irgacure | 0.36 |
| Quantacure ITX | 0.30 |
| Quantacure EPD | 0.30 |
| Benzotriazole | 0.35 |
| TAOBN | 0.003 |
| Triethyleneoxidetriacrylate (TEOTA-1000) | 3.40 |
| Trimethylolpropanetriacrylate (TMPTA) | 0.70 |
| Milled CdO Powder | 0.40 |
| Glass powder, borosilicate, inorganic binder | 1.30 |
| Silver powder, irregular ~6–9μ diameter | 0.70 |
| Gold Powder, 3 to 4μ irregular spheroidal | 40.00 |
| Gold Powder, 2.4μ spherical | 40.00 |
| Vazo-88 free radical source | 0.13 |

The gold paste was printed with a 270 mesh screen with 1.1 wires mounted at 22 degrees off orthogonal. Initial dry was for 15 minutes at 100°–110° C., followed by exposure at from 150 to 450 millijoules/cm sq. Hereinafter, for example 1, the gold paste devoid solvent is referred to as "film". After exposure a second thermal cure was used, from 10 to 15 minutes at 110°–125° C. The thermal cure effects additional crosslinking in the film. The optimum degree of crosslinking is such that the unexposed areas remain soluble in the developing fluid, but close to the point where the layer becomes insoluble. Exposure speed of the film increases, and the degree of undercut and edge curl decreases, as the point is approached where the layer becomes insoluble.

Developing is done in a conveyorized spray unit wherein the exposed and post cured film is sprayed with an aqueous carbonate solution, followed by water rinse and a blow dry with high pressure air jets.

Testing results are summarized in TABLE I, which sums up the appearance of parts processed using thermal assist both pre-expose and post-exposure.

TABLE I

| | Exposure | | | Results of Process | | | |
|---|---|---|---|---|---|---|---|
| Drying Time | Temp (°C.) | @ 15 mj/cm$^2$ (Sec.) | Post Cure Min. | Temp Cure | Edge Curl | Edge Defin | Resl,n @ 60$\mu$ line space |
| 10 | 100 | 20 | 10 | 115 | 1 | 1.5 | 1 |
| 10 | 100 | 27 | 10 | 115 | 1 | 3 | 1 |
| 10 | 100 | 35 | 10 | 115 | 1 | 3 | 1 |
| 10 | 100 | 20 | 15 | 115 | 2 | 2 | 1 |
| 10 | 100 | 27 | 15 | 115 | 1 | 2 | 1 |
| 10 | 100 | 35 | 15 | 115 | 1 | 2 | 1 |
| 10 | 100 | 20 | 15 | 120 | 1 | 1 | 3 |
| 10 | 100 | 27 | 15 | 120 | 2 | 2 | 3 |
| 10 | 100 | 35 | 15 | 120 | 1 | 3 | 1 |
| 10 | 110 | 20 | 10 | 120 | 4 | 1 | 5 |
| 10 | 110 | 27 | 10 | 115 | 1 | 1 | 1 |
| 10 | 110 | 35 | 10 | 115 | 1 | 2 | 1 |
| 10 | 110 | 20 | 15 | 115 | 2 | 1 | 4 |
| 10 | 110 | 27 | 15 | 115 | 2 | 1 | 3 |
| 10 | 110 | 35 | 15 | 115 | 1 | 2 | 1 |
| 10 | 110 | 20 | 15 | 120 | 3 | 1 | 4 |
| 10 | 110 | 27 | 15 | 120 | 1 | 3 | 1 |
| 10 | 110 | 35 | 15 | 120 | 1 | 2 | 3 |

Legend of the Table: Edge definition: 1 very sharp, 5=badly eroded. Edge curl: 1 to 5, approximately, in microns; Resolution: 1, resolves 20 micron lines, and 5, poorly resolves 60 micron lines. Resolution loss mostly due to line washout.

Examples 2–5

This is a solderable Pt/Ag series; Example 2 has a bimodal particle size distribution, and 3–5 are essentially trimodal. Trace amounts of Pt is added to deter solder leaching and aid in the bonding of aluminum wires. The trimodal PSD permits reduction in vehicle content.

| Vehicle Ingredient | Parts (wt.) |
|---|---|
| Texanol Solvent | 52.2 |
| polyvinylpropanol/vinylacetate emulsion | 1.65 |
| BFG XPD-1234 | 38.8 |
| Irgacure | 2.75 |
| Quantacure ITX | 2.3 |
| Quantacure EPD | 2.3 |

The above materials were processed to produce a paste using techniques familiar to one skilled in the art of paste formulation. The vehicle was prepared as follows. The solvent and resin were added and heated under a nitrogen blanket to 110° for thirty minutes, in order to expel the moisture content of the resin. The resin/solvent solution was then cooled to 70°, and the remaining ingredients were added.

The photopatternable paste was made as follows. The organic ingredients were mixed together, after which the inorganic components were added with continuous mixing, with the silver powders being added last. After thoroughly mixing the ingredients together, the resulting mixture was roll milled to produce an acceptable dispersion (evidenced by a Hegman grind gauge of better that 15/8).

The pastes were printed using 325, 280, 230 or 200 mesh screens. The 325 mesh print is 8–9 microns thick after firing; the 270 and 230 mesh prints produced a 9–11 micron fired film; and the 200 mesh prints produced a 10 to 12 micron thick fired film. Drying after printing was for 15 minutes at 100°. Exposure was 15 to 30 seconds at 15 millijoules/cm sq and about half that at 30 mj/sq cm. Curing after exposure to thermally crosslink was for 15 minutes at 120° C. Firing was on a 30 minute furnace profile (30 minutes in the heated part of the furnace muffle), with 10 minutes at a peak of 850° C.

GLOSSARY:

Ektasolve DE Acetate: Solvent/plasticizer from Eastman Chemicals
Polymer XPD-1234: PMMA/MAA copolymer from B. F. Goodrich
Irgacure®: substituted acetophenone available from Dupont

| | Parts (wt.) | | | |
|---|---|---|---|---|
| Paste Ingredient Description | Example 2 | Example 3 | Example 4 | Example 5 |
| Vehicle (listed below) | 21 | 20 | 19 | 21.0 |
| Eastman Texanol | 0 | 1.4 | 3.7 | 3.6 |
| Copper Oxide, Y-milled | 0 | | | |
| Bismuth Ruthenate Pyrochlore | 1.1 | 0.5 | 0.5 | .0.5 |
| Nickel Boride, milled | 0.7 | 0.4 | 0.4 | 0.4 |
| Bismuth Oxide, milled | 1.2 | 1 | 1 | 1.0 |
| Bismuth Oxide, finely milled | 1.2 | 1 | 1 | 1.0 |
| Glass Frit | 3.6. | 0 | 0 | 3.4 |
| Cyclohexanecarbonitrile, 1,1"-azobis- | 0.1 | 0.1 | 0.1 | |
| Zinc Oxide | 0.3 | 0.3 | 0.5 | |
| 5$\mu$ Ag Powder | 45.6 | 39.1 | 39.2 | 0 |
| 3.75 micron "P3011" | 0 | 0 | 0 | 38 |
| Submicron silver | 0 | 7 | 7 | 6.8 |
| Spherical silver powder, 1.5–2 microns | 18 | 19 | 19 | 18.5 |
| Pt powder, dendritic | 0.7 | 0.5 | 0.5 | 0.5 |
| TEOTA 1000 | 5.3 | 5 | 3.9 | 3.8 |
| TMPTA | 1.3 | 1 | 0.7 | 0.7 |
| Baker Thixatrol ST | 0.2 | 0.2 | 0.2 | 0.20 |
| 1,1"-azobis-cyclohexanecarbonitriie | 0.1 | 0.1 | 0.1 | 0.1 |

Quantacure ITX: isopropyl-isoxanthone available from Dupont

Quantacure EPD: ethyl 4-dimethylaminobenzoate available from Dupont

TAOBN: Free radical interceptor available from Dupont

TEOTA-1000: Polyyethoxylated Trimethylolpropane triacrylate, $\overline{M}_w$=1162

TMPTMA: Trimethylol propane trimethacrylate, $\overline{M}\backslash W$=338 available from Sartomer Co., West Chester, Pa.

Milled CdO powder: Cadmium oxide milled to under 3 micron d50 particle size

VAZO-88: 1,1'-Azobiscyclohexanecarbonitrile available from E. I. du Pont de Nemours and Company Texanol®: alcohol/ether/ester solvent available from Eastman Chemicals Glass frit used in Examples 2, 3, and 4 is 77.5 wt % $Bi_2O_3$, 7.5 wt. % PbO and 15 wt. % $SiO_2$ Submicron silver: silver precipitated by a proprietary process to <1 micron particle size Thixatrol ST: Hydrogenated castor oil microcrystals available from Baker

What is claimed is:

1. A photosensitive thick film composition comprising an admixture of:
   (a) finely divided electrically conductive or dielectric particles, dispersed in;
   (b) an organic medium, comprising:
      (1) at least one acrylic monomer;
      (2) a photoinitiation system;
      (3) a thermal assist catalyst; and
      (4) an acidic acrylic polymer.

2. The composition of claim 1 further comprising an organic solvent.

3. The composition of claim 2 which is of a paste consistency suitable for screen printing.

4. A photosensitive conductive tape comprising a layer of the composition of claim 2 from which the organic solvent has been removed by volatilization.

5. The composition of claim 1 wherein the conductive or dielectric particles are a trimodal combination of particles.

6. The composition of claim 5 wherein the trimodal conductive particles have a volume ratio from largest to smallest in the range of about 10:3:1 to 4:2:1.

7. The composition of claim 1 wherein the conductive or dielectric particles are a bimodal combination of particles.

8. The composition of claim 7 wherein the bimodal conductive or dielectric particles have a volume ratio from large to small in the range of about 4:1 to 1:1.

9. The composition of claim 1 wherein the conductive particles are gold or silver.

10. The composition of claim 1 comprising, based on total composition, 50–88 wt. % finely divided electrically conductive or dielectric particles and 12–50 wt. % organic medium.

11. The composition of claim 1 further comprising inorganic binder composed of metal oxides or glass or an admixture thereof.

12. The composition of claim 1 further comprising plasticizer.

13. The composition of claim 1 further comprising inorganic binder.

14. The composition of claim 1 further comprising dispersant.

15. The composition of claim 1 wherein the thermal assist catalyst is 1,1 azobiscyclohexanecarbonitrile.

16. A single print process for the formation of fine conductor lines on a substrate comprising the sequential steps of:
   a. applying the paste of claim 3 to cover an area to be patterned over a substrate, in a sufficient amount to produce sintered patterns with a thickness of 4 to 20 microns;
   b. drying the paste at a temperature sufficient to cause partial thermally induced polymerization and simultaneously drive off the solvent;
   c. imagewise exposing the dried paste patternwise to actinic radiation to produce a latent image;
   d. thermally treating the patterned paste to induce further polymerization leading to crosslinking in exposed areas of the print, so that exposed areas become insoluble in the developing fluid;
   e. developing the patterned paste in a suitable developer fluid to wash away unexposed areas of the patterned paste; and
   f. sintering the patterned paste.

17. A process for the formation of fine conductor lines on a substrate comprising the sequential steps of:
   a. applying the tape of claim 4 to cover an area to be patterned over a substrate;
   b. imagewise exposing the tape patternwise to actinic radiation to produce a latent image;
   c. thermally treating the tape to induce further polymerization leading to crosslinking in exposed areas of the tape, so that exposed areas become insoluble in the developing fluid;
   e. developing the tape in a suitable developer fluid to wash away unexposed areas of the tape; and
   f. sintering the tape.

18. The process of claim 17, wherein after step a. the tape is thermally treated at a temperature sufficient to cause partial thermally induced polymerization.

\* \* \* \* \*